United States Patent

Hasegawa et al.

[11] Patent Number: 5,888,075
[45] Date of Patent: Mar. 30, 1999

[54] AUXILIARY APPARATUS FOR TESTING DEVICE

[75] Inventors: Yoshiei Hasegawa, Kanagawa-ken; Eichi Osato, Aomori-ken, both of Japan

[73] Assignee: Kabushiki Kaisha Nihon Micronics, Tokyo, Japan

[21] Appl. No.: 977,182

[22] Filed: Nov. 24, 1997

[30]     Foreign Application Priority Data

Feb. 10, 1997  [JP]  Japan .................................. 9-039734
May 15, 1997  [JP]  Japan .................................. 9-139100

[51] Int. Cl.⁶ ........................................................ H01K 9/09
[52] U.S. Cl. .............................. 439/73; 439/72; 324/765; 324/755
[58] Field of Search ................... 439/72, 73, 70; 324/755, 754, 765

[56]            References Cited

U.S. PATENT DOCUMENTS

| | | | |
|---|---|---|---|
| 4,295,700 | 10/1981 | Sado ..................... | 339/61 M |
| 4,402,562 | 9/1983 | Sado ..................... | 339/61 M |
| 4,445,735 | 5/1984 | Bonnefoy .............. | 339/17 M |
| 4,506,938 | 3/1985 | Madden ................. | 339/17 CF |
| 5,069,629 | 12/1991 | Johnson ................. | 439/71 |
| 5,076,798 | 12/1991 | Uratsuji ................. | 439/269 |
| 5,207,584 | 5/1993 | Johnson ................. | 439/66 |
| 5,254,834 | 10/1993 | Johnson ................. | 219/121.72 |
| 5,273,442 | 12/1993 | Laub ..................... | 439/73 |
| 5,312,267 | 5/1994 | Matsuoka et al. ..... | 439/331 |
| 5,336,094 | 8/1994 | Johnson ................. | 439/62 |
| 5,360,348 | 11/1994 | Johnson ................. | 439/72 |
| 5,388,996 | 2/1995 | Johnson ................. | 439/65 |
| 5,562,473 | 10/1996 | Ikeya et al. ........... | 439/331 |
| 5,572,407 | 11/1996 | Sobhani ................. | 361/719 |
| 5,594,355 | 1/1997 | Ludwig .................. | 324/755 |

FOREIGN PATENT DOCUMENTS

| | | |
|---|---|---|
| 5-299483 | 11/1993 | Japan . |
| 6-208876 | 7/1994 | Japan . |
| 07229949 | 8/1995 | Japan . |

*Primary Examiner*—Edgar Burr
*Assistant Examiner*—Dave A. Ghatt
*Attorney, Agent, or Firm*—Christensen O'Connor, Johnson & Kindness PLLC

[57]            ABSTRACT

The auxiliary apparatus comprises a base plate having a plurality of wiring portions on one face, a plurality of probes, and assembling means for assembling the probes in parallel to each other into the base plate. The assembling means presses the probes by a needle pressing portion extending in the arranging direction of the probes, bringing at least a part of deformed portions of the probes into contact with the wiring portions of the base plate, and each probe is pressed at the tip end of its needle front portion continued to one end of the deformed portion against an electrode portion of a device under inspection. Thereby, the probe is sandwiched between the base plate and the needle pressing portion to be maintained in that state and, in addition, scrapes off a film such as an oxide film existing in the electrode portion by the tip end of the needle front portion. The effective area of the probe is from the portion in contact with the wiring portion to the portion at the side of the needle tip and is smaller than the conventional probe.

18 Claims, 13 Drawing Sheets

AUXILIARY APPARATUS FOR TESTING DEVICE

FIELD OF THE INVENTION

The present invention relates to an auxiliary apparatus for use in testing a flat plate-like device to be inspected such as an integrated circuit or a liquid crystal panel.

BACKGROUND OF THE INVENTION

Generally, an inspection or a test of electrical characteristic of a packaged or molded semiconductor device, more particularly, an integrated circuit (IC) is generally performed by utilizing an inspection socket, that is, a test socket, i.e., an auxiliary apparatus to which a semiconductor device is removably attached.

There is provided an auxiliary apparatus of such a type using a crank-shaped contact, i.e., a probe wherein a needle front portion to be in contact with a lead (electrode portion) of a semiconductor device and a needle tail portion to be connected to wiring portions of a base plate are bent in the opposite directions (Japanese Patent Appln. Public Disclosure No. 7-229949).

In this conventional auxliary apparatus, each probe is attached to a common needle holder by an adhesive in the intermediate portion between the needle front portion and the needle tail portion such that the needle front portion extends upward and the needle tail portion extends downward. In this conventional auxiliary apparatus, however, an assembling work such as attaching a probe to the needle presser or soldering the needle tail portion to the wiring portions of the base plate requires skill, and since the length dimension of an effective area (from the tip end of the probe to a connecting point to the wiring portions) is great, there is a limitation in raising the frequency of an electric signal used for testing.

There is another auxiliary apparatus for testing which uses a plate-like probe formed in a Z-like or an annular shape (U.S. Pat. No. 5,336,094 and U.S. Pat. No. 5,388,996). In this conventional auxiliary apparatus, however, each probe is pressed against an electrode portion of a device to be inspected in its arc-shaped deformed face portion, no scraping action due to a displacement of the deformed face portion relative to the electrode portion occurs, so that a film like an oxide film existing in the electrode portion is not effectively eliminated. Consequently, a favorable electric contact between the probe and the electrode portion cannot be obtained.

There is an auxiliary apparatus for testing the electrical characteristic of a non-packaged or non-molded semiconductor device, particularly an IC chip, which uses a probe bent in a C-like shape (Japanese Patent Appln. Public Disclosure No. 5-299483). According to this conventional auxiliary apparatus, however, since each probe is only held in a socket by its own spring force, the probe is unstable, and since both ends of the C-like shape must be further curved, the probe becomes complicated in shape and expensive.

Accordingly, in an auxiliary apparatus for testing device, it is important to simplify the shape of a probe, to enhance the stability of the probe, to make it adapted to a high frequency test, and to facilitate manufacturing same, in spite of giving an effective scraping action to the electrode portion of the device to be inspected.

SUMMARY OF THE INVENTION

The auxiliary apparatus for testing device relative to the present invention comprises a base plate having a plurality of wiring portions in one face, a plurality of probes, and assembling means for assembling the probes in parallel into the base plate. Each probe includes a curved deformed portion, a needle front portion continuing from one end of the deformed portion and having a tip end or needle point to be pressed against an electrode portion of a device to be inspected, and a needle tail portion continuing from the other end of the deformed portion. The assembling means has a needle pressing portion for pressing the probes so as to bring at least a part of the deformed portions of the probes into contact with the wiring portions of the base plate and extending in the arranging direction of the probes.

Though having the deformed portion, the probe is simple in shape in comparison with the conventional C-shaped probe and less expensive. The probes are pressed against the wiring portions of the base plate at least at a part of the deformed portions by the needle pressing portion and sandwiched between the base plate and the needle pressing portion to be maintained in that state, so that the probes are stabilized to facilitate assembling of the auxiliary apparatus.

Each probe, similarly to the conventional crank-shaped probe, is pressed at the tip end of the needle front portion against the electrode portion of the device to be inspected. Thereby, each probe is elastically deformed at a portion between the portion in contact with the wiring portion and a portion at the side of the needle point, and the tip end is displaced relative to the electrode portion. As a result, a part of the film like an oxide film existing in the electrode portion is scraped off by the tip end of the needle front portion (or scratched away) and the probe and the electrode portion are maintained in a favorable electrically connected state. Also, from the portion in contact with the wiring portion to the side of the tip end becomes an effective area, so that the probe has a smaller effective area than the conventional probe, to reduce a leakage of the electric signal between adjacent probes and to make the probe suitable for a high frequency test.

As mentioned above, according to the present invention, a favorable state of electrical connection is maintained between the probe and the electrode portion by an effective scraping action caused between the tip end and the electrode portion. Also, in comparison with a C-shaped one, the probe is simple in shape and costs less. Further, the effective area of the probe becomes smaller and suitable for a high frequency test. Still further, the probe is maintained stable, thereby facilitating manufacture of the auxiliary apparatus.

The assembling means includes at least one cover assembled into the base plate and one or more needle pressers received in a recess so as to extend in the arranging direction of the probes, wherein the recess is opened at least at the side of the base plate and the needle pressing portion can be formed in the needle presser. Thus, since each probe can be maintained by disposing the deformed portion of each probe in a groove, the manufacture of the auxiliary apparatus is facilitated though the probes can be maintained in a more stable state.

It is possible to form the cover so as to further have a plurality of grooves at intervals in the arranging direction of the probes, open these grooves toward both sides of the base plate and the opening, open the recess toward the grooves, and dispose at least the deformed portions of the probes in the grooves.

The needle pressing portion can be made to abut against the inside portion of at least the deformed portion of the probe by projecting it from the recess of the cover to the side of the base plate. Also, the cross-sectional shape of the recess of the cover can be made arc-like or rectangular.

The needle presser can be made cylindrical, and at least the outer peripheral portion of the needle presser can be electrically insulated. Thus, the structure of the needle presser is simplified, and an electrical short-circuit between the probes by the needle presser can be prevented.

The needle presser can include a presser bar and an elastic material layer formed of an electrically insulated material around the presser bar. Thus, not only an electrical short-circuit between the probes by the needle presser can be prevented but also the probes are pressed against the base plate through the elastic material, so that the probes can be maintained in a more stable state.

The needle tail portion of the probe can be pressed against the inner face of the recess by the needle presser. Thereby, the relative displacement in the longitudinal direction of the probe between the needle presser and the probe can be surely hindered, so that the probes can be maintained in a more stable state.

The probe may be formed to have a generally curved arc-like shape or a generally curved U-like shape. Also, the needle front portion of each probe can be projected through the opening of the cover.

Each probe can be formed of a conductive material with a non-conductive material layer formed in the outer periphery of the needle tail portion. Thereby, an electrical short-circuit in the needle tail portions of adjacent probes can be prevented.

However, each probe may be formed of a non-conductive material with a conductive material layer formed in the outer peripheries of the needle front portion and the deformed portion, or the entire needle tail portion of each probe may be formed of a non-conductive material with the needle tail portions formed of two or more probes integrally of a non-conductive material.

Since in none of the above-mentioned probes the needle tail portion has conductivity, not only an electrical short-circuit in the needle tail portions of adjacent probes can be prevented but also the length dimension of the conductive portion is shortened. As a result, there is no leakage of an electric signal in the needle tail portion, and besides, a leakage of an electric signal between adjacent probes occurs less than the conventional apparatus, so that the frequency of an electric signal used for a high frequency test can be increased.

It is, however, possible to form the entire needle tail portion of each probe of a non-conductive material and to form the needle tail portions of two or more probes integrally of a non-conductive material.

The needle tail portions of two or more probes can be integrated with a non-conductive material and received in the recess. Thereby, it is enabled to manufacture needle assemblies composed of the deformed portions of two or more probes, the needle front portions and the integrated needle tail portions at one time by fabrication from a synthetic resin and to assemble them on the base plate at one time, facilitating the manufacture of the needle assemblies and also facilitating the assembling work of the apparatus and, consequently, the manufacturing work of the apparatus.

Assembling means includes at least one cover assembled into the base plate and at least one needle presser having a needle pressing portion, the cover having a first recess extending in the arranging direction of the probes and opening at the side of the base plate, a slot communicating with the first recess, and a second recess extending in the arranging direction of the probes and opening at the side of the first recess, and it is possible to juxtapose the probes with the needle tips projected from the slot and to dispose the needle presser in the second recess. A plurality of probes, the cover and the needle presser made into a unit can be assembled into the base plate.

Each probe can include at the side of the needle tip a spacer abutting against an adjacent probe. Thereby, when the probe is pressed against the electrode portion of the device to be inspected, the adjacent probes are prevented from contacting each other at the side of the needle tips, though the probe effectively gives a scraping action to the electrode portion of the device to be inspected.

DETAILED DESCRIPTION OF THE PREFERRED EMBODIMENTS

Figure 1:
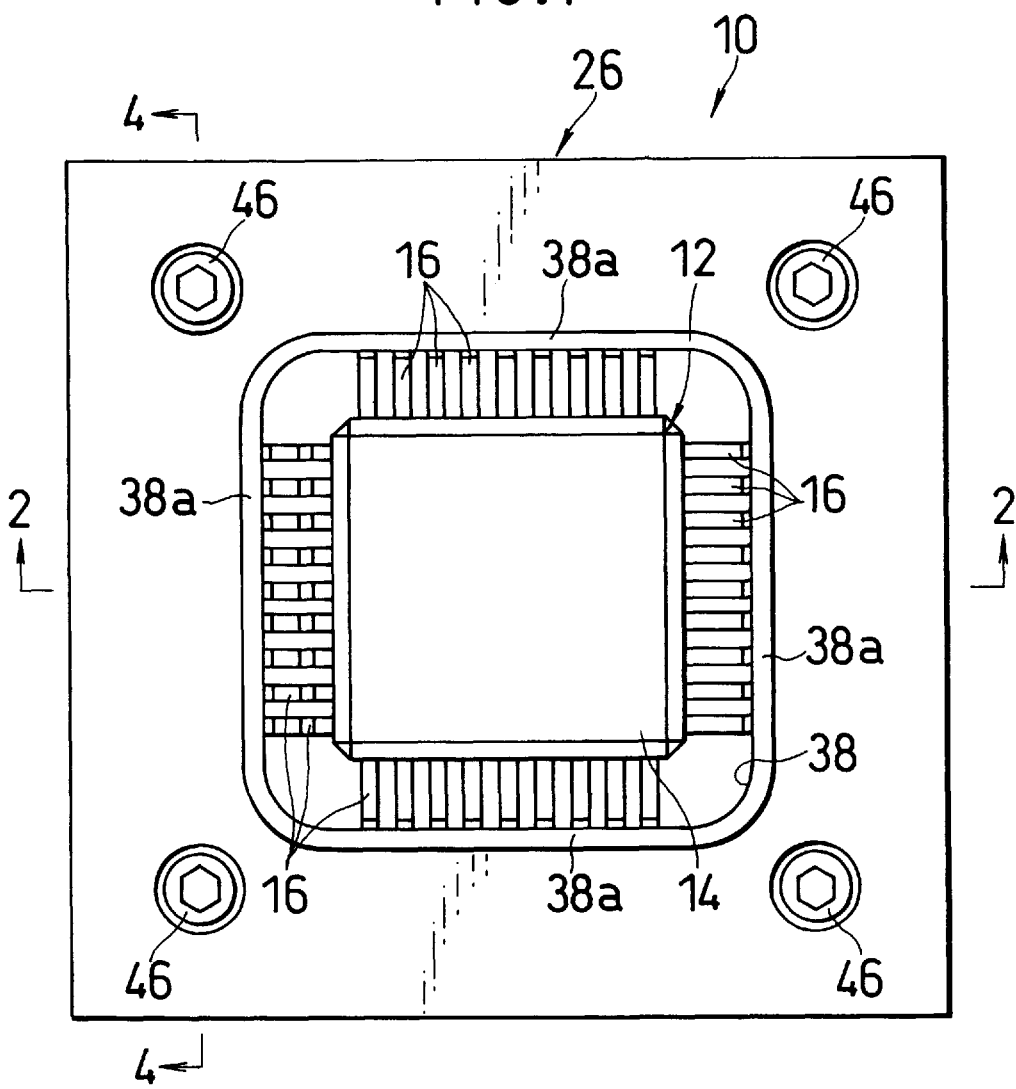
FIG. 1 is a plan view showing a first embodiment of an auxiliary apparatus for testing of the present invention.
Figure 2:
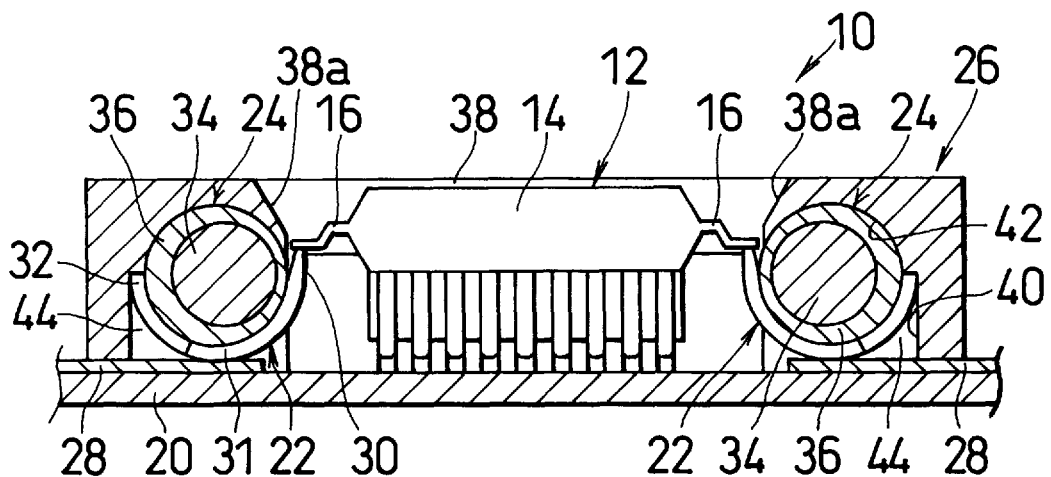
FIG. 2 is a sectional view taken along the line 2—2 of FIG. 1.
Figure 3:
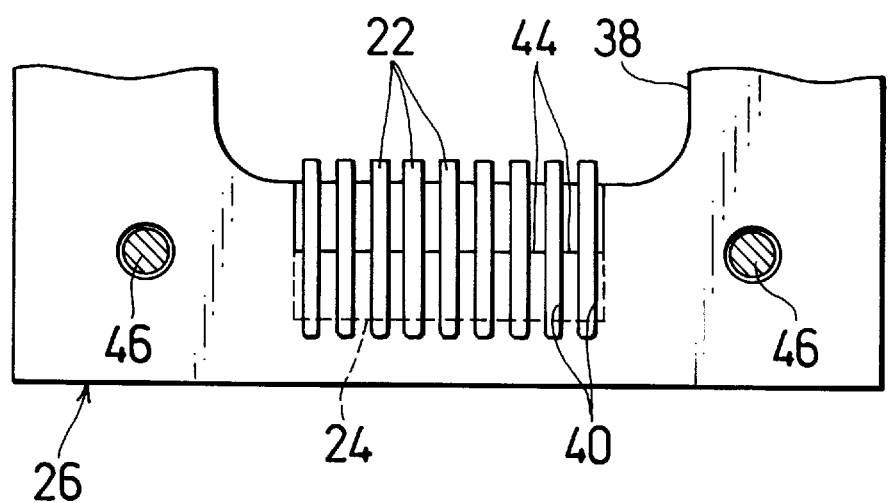
FIG. 3 is a bottom view of a part of the auxiliary apparatus for testing shown in FIG. 1 with the base plate removed.
Figure 4:
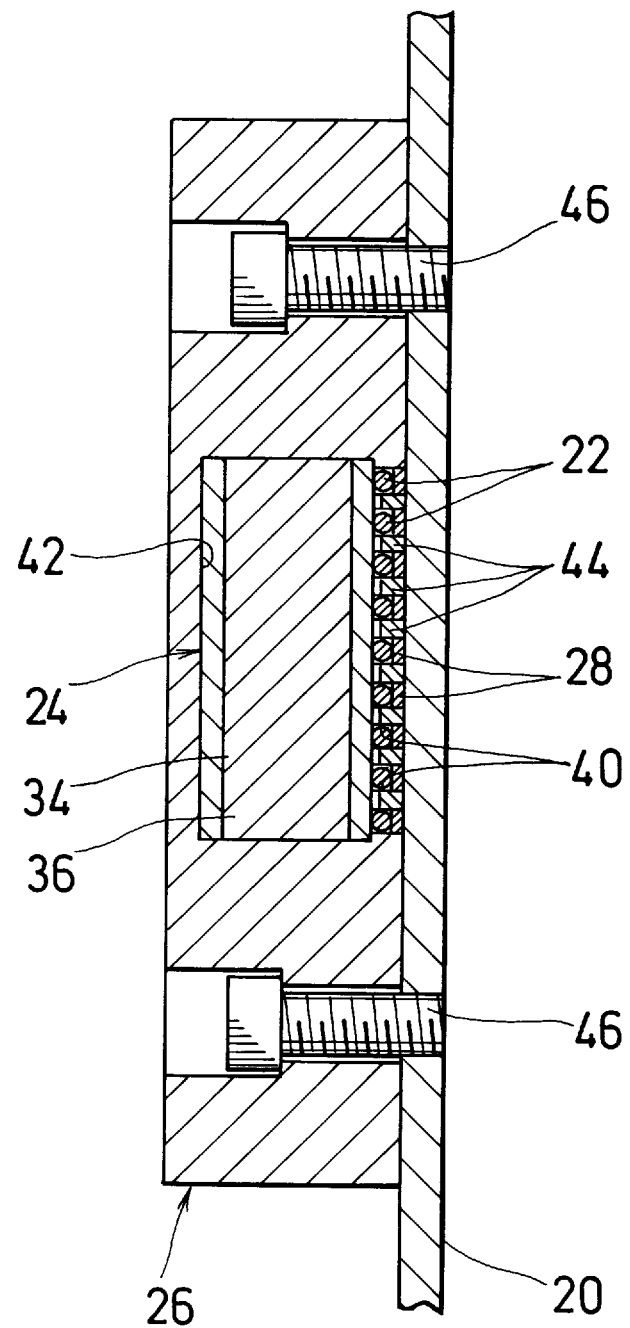
FIG. 4 is a cross-sectional view taken along the line 4—4 of FIG. 1.

Referring to FIGS. 1 to 6, an auxiliary apparatus 10 is used as a test socket for inspecting, i.e., testing a flat plate-shaped device 12 to be inspected. In the illustrated embodiment, the device 12 is a semiconductor device such as a packaged or molded integrated circuit, but the present invention can also be applied to an auxiliary apparatus for testing another flat plate-shaped device such as a liquid crystal display panel.

The device 12 includes a base portion 14 packaged or molded in a rectangular flat shape, and a plurality of leads, i.e., electrode portions 16 projecting outward from a portion corresponding to each side of the rectangle. The electrode portions 16 are divided into a plurality of electrode portion groups corresponding to each side of the rectangle, and the electrode portion groups are juxtaposed.

The auxiliary apparatus 10 for testing comprises a base plate 20, a plurality of contacts, i.e., probes 22, a plurality of needle holders, i.e., needle pressers 24 for pressing the probes 22 against the base plate 20, and a flat plate-shaped cover 26 for assembling the needle pressers 24 into the base plate 20.

The base plate 20 is a printed wiring board with a wiring pattern formed on one surface of an electrically insulated material by a print wiring technique, and has a plurality of wiring portions 28 respectively corresponding to the probes 22 on one surface. Each wiring portion 28 is a part of the wiring pattern. The wiring portions 28 are divided into a plurality of wiring portion groups corresponding to each side of the rectangle of the base portion 14 of the device 12, and the groups of wiring portions are juxtaposed.

Each probe 22 is formed in a shape of elastic non-conductive fine line, and its tip end portion is curved like a semi-circular arch over the whole area from the tapered needle front portion 30 to the needle tail portion 32 through the needle base portion, i.e., the deformed portion 31.

Figure 7A:
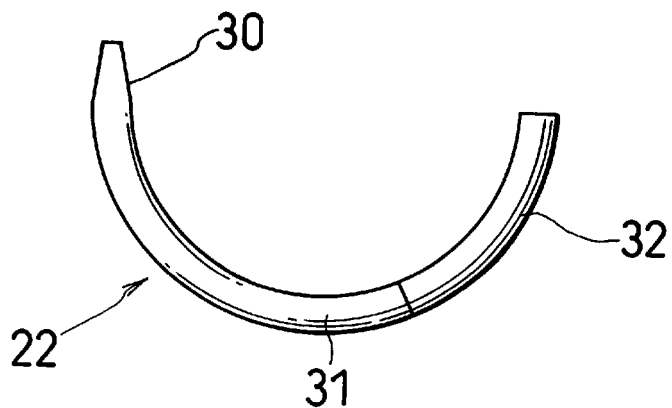
FIG. 7 are views showing the first embodiment of the probe used in the auxiliary apparatus shown in FIG. 1, in which (A) is a front elevation and (B) is a left side view.
Figure 7B:
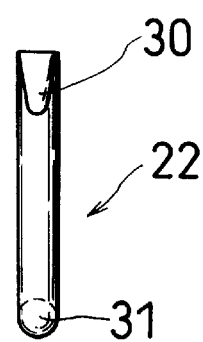
Figure 8A:
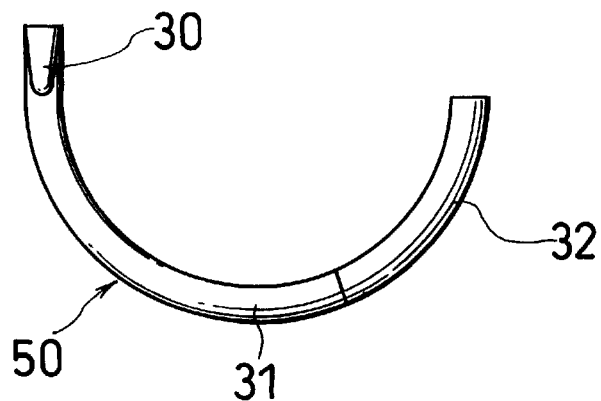
FIG. 8 are views showing a second embodiment of the probe used in the auxiliary apparatus shown in FIG. 1, in which (A) is a front elevation and (B) is a left side view.
Figure 8B:
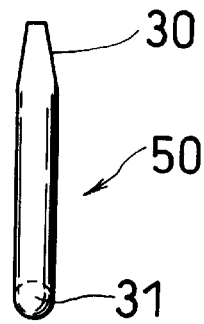

Each probe 22 has an electrically conductive coating formed in portions other than the needle tail portion in the area shown by the reference numeral 32 in FIGS. 7A and 7B, that is, in the entire external surfaces of the needle front portion 30 and the deformed portion 31. Thereby, the portion ahead of the portion in contact with the wiring portion 28 has electrical conductivity, while the needle tail portion 32 has electrical non-conductivity. Therefore, though acting as a conductive probe, there is no leakage of an electric signal for testing in the needle tail portion 32, particularly no leakage of an electric signal between adjacent probes.

However, each probe 22 may have a core formed in a shape of electrically conductive fine line, or preferably in a shape of metal fine line, with electrically non-conductive coating formed in the needle tail portion 32 in the core. The probe 22 may be formed of a fine line of metal, ceramic, synthetic resin or the like, and by a process such as press working, etching work, etc., using such a material.

Each probe 22 has a circular cross-sectional shape in the examples shown in FIGS. 1 through 7. Further, the probe 22 is a so-called chisel-type needle with its needle tip face, i.e., tip end face extending at right angles to the curved face of the probe 22.

Each probe 22 as well as each probe described later, however, may be an ax-type needle with its tip end face extending parallel to the curved face of the probe 22, or of a shape having a conical or pyramidal needle front portion. The cross-sectional shape of the probe may be circular or square.

The probes 22 are divided into a plurality of probe groups corresponding to each side of the rectangle of the base portion 14 of the device 12 to be inspected. In the illustrated embodiment, the device 12 has a plurality of electrode portions at each of the four sides of the rectangle, and the probes 22 are divided into four probe groups. For the same reason, in the illustrated embodiment, four needle pressers 24 are provided.

Each needle presser 24 is shaped cylindrically by a cylindrical presser bar 34 and an electrically insulated elastic material layer 36 formed in the outer peripheral surface of the presser bar 34. The presser bar 34 can be a conductive or a non-conductive bar-like member. An electrically insulated layer, i.e., the elastic material layer 36 may be a tube formed of a rubber material such as silicon rubber. The needle presser 24 may, however, be formed in a bar-like shape of a single member.

The cover 26 includes an opening 38 formed in the center so as to accommodate the device 12, a plurality of grooves 40 formed outside the opening 38 so as to extend outwardly relative to the opening 38, and a plurality of recesses 42 formed outside the opening and extending in the arranging direction of the grooves 40. Such a cover 26 can be formed of an electrically non-conductive material.

The opening 38 has a rectangular shape of a similar figure to the device 12 with their respective corner portions arc-shaped. The upper portion of the opening 38 is tapered downward by an inclined surface 38a directed from the outside toward the center side. Each corner portion of the opening 38 is an arc-shaped face.

The groove 40 is a groove for accommodating at least the deformed portion 31 and the needle tail portion 32 of the probe 22. Accordingly, in the illustrated embodiment the same number of the grooves as that of the probes 22 are provided. The grooves 40 are divided into a plurality of groove groups corresponding to each side of the rectangle forming the opening 38 and the respective groove groups are juxtaposed. Each groove 40 opens at the side of the base plate 20, that is, downward and at the opening 38.

Adjacent grooves 40 are divided by partition walls 44. The partition walls 44 are provided, in the illustrated embodiment, so as to divide the rear half of the groove 40, and therefore, adjacent grooves 40 are continuous at the portion of the opening 38. However, the partition walls 44 may be provided so as to divide the entire grooves 40.

The recesses 42 correspond to each side of the rectangle forming the opening 38 and extend along the corresponding side. In the illustrated embodiment, four recesses 42 are provided. Each recess 42 is a semicircular groove accommodating the needle presser 24 and opens at the groove bottom surface of the corresponding groove 40. The cross-sectional shape of the groove bottom surface of each recess 42 is upwardly convex.

The auxiliary apparatus 10 can be assembled by disposing each needle presser 24 in the recess 42, each probe 22 in the groove 40 such that its rear end abuts against the deep bottom surface (in the illustrated embodiment, the upper surface), overlapping in that state the probe 22, the needle presser 24 and the cover 26 on the base plate 20, and attaching the cover 26 to the base plate 20 with a plurality of screw members 46 such as bolts.

Each screw member 46 penetrates the cover in its thickness direction and is screwed into a screw hole formed in the base plate 20. As a result, the probe 22 is pressed against the wiring portion 28 of the base plate 20 at a part of the arc-shaped curved portion by the needle presser 24 and maintained in a state of being sandwiched between the base plate 20 and the needle presser 24.

In the illustrated embodiment, the needle presser 24 and the cover 26 act as means for assembling the probes 22 in parallel in the base plate 20. Also, since the lower half portion of each needle presser 24 projects in an arc-like shape from the recess 42 to the side of the base plate 20 and extends in the arranging direction of the probes 22, they act as a needle pressing portion abutting on the inside of the curved portion of the probe 22 go as to press the probe 22 against the base plate 20.

By merely disposing the probes 22 in the grooves 40 such that the needle front portions 30 project upward within the opening 38 and pressing them against the base plate 20 with the needle pressers 24, the probes 22 can be correctly juxtaposed according to probe groups. Therefore, it is easy to manufacture the auxiliary apparatus 10.

Since at least the needle tail portion 32 of the probe 22 is received in a portion divided by the partition wall 44 in the state of being assembled into the auxiliary apparatus 10 and pressed against the base plate 20 through the elastic material layer 36 composed of an electrically insulated material, the probe 22 is maintained in a more stable state by the groove 40 and the needle presser 24 to be surely prevented from being brought into electrical contact with the adjacent probe.

In an assembled state, each probe 22 is pressed against the wiring portion 28 at a portion of the deformed portion 31 where no electrically insulated layer 32 exists, so that the portion of the base portion 31 of the arc-shaped needle acts as the deformed portion.

Figure 5:
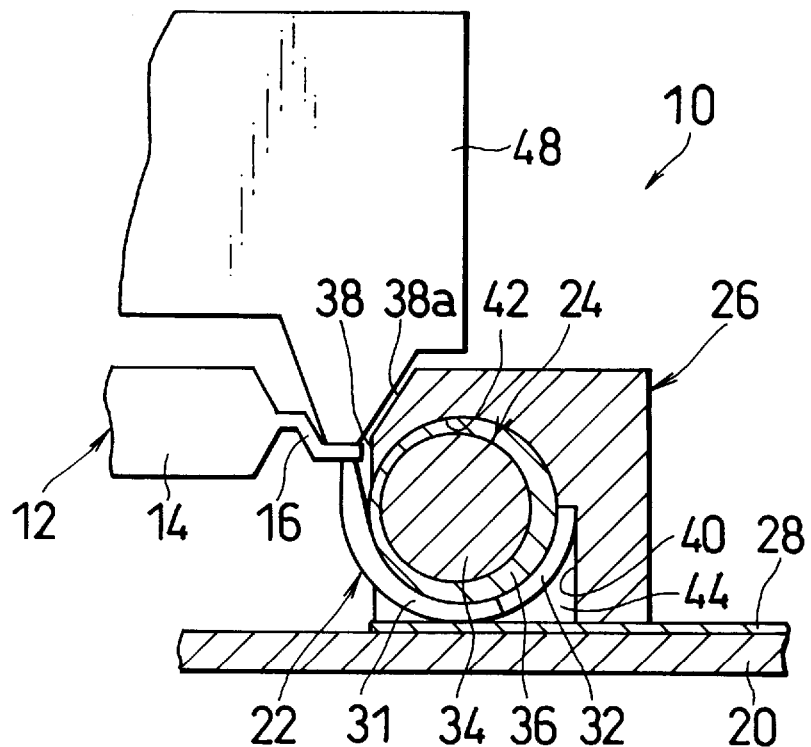
FIG. 5 is a cross-sectional view for explaining a state of a probe when a device to be inspected is disposed in the auxiliary apparatus.

Since each probe 22 is pressed against the wiring portion 28 at a position where no electrically insulated layer 32 exists, the effective area of the probe 22 is from the portion of the probe 22 in contact with the wiring portion 28 to the needle point or needle tip, and is smaller than the conventional auxiliary apparatus. Also, as shown in FIG. 5, since the elastic material layer 36 is pressed against the base plate 20, the cover 26 and the presser bar 34 to be deformed, each probe 22 is firmly maintained. The presser bar 34 and the elastic material layer 36 may be previously made eccentric to each other or may be made eccentric to each other in the assembled state.

In inspecting, the device 12 is put in the opening 38 from above. At this time, if the position of the device 12 is deviated relative to the auxiliary apparatus 10, the device 12 abuts against the inclined surface 38a and is guided by the inclined surface 38a to the center of the opening 38. Thereby, the device 12 is, as shown in FIG. 5, accommodated in the auxiliary apparatus 10 in a state that the electrode portion 16 abuts against the needle point, i.e., the tip end of the probe 22.

Figure 6:
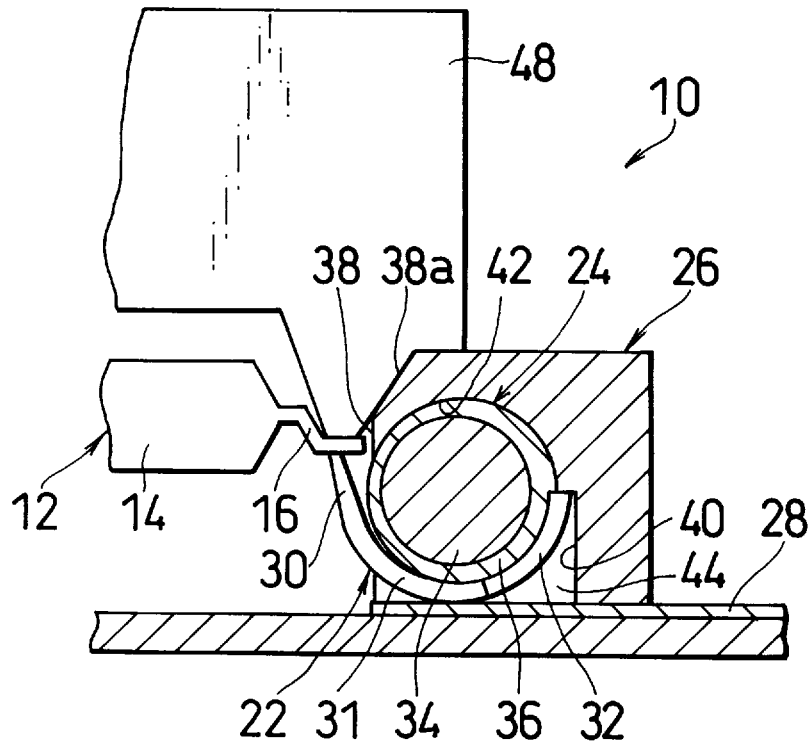
FIG. 6 is a cross-sectional view for explaining a state of a probe when a device to be inspected is pressed against the probe.

When the device 12 disposed in the auxiliary apparatus 10 is pressed down by a presser 48, each probe 22 is deformed as shown in FIG. 6. At this time, the rear end of each probe 22 is in contact with the deep bottom surface of the groove 40, so that each probe 22 does not move around the needle presser 24 in the peripheral direction.

However, when the probe 22 and the device 12 are pressed, each probe 22 is elastically deformed at a portion from the portion in contact with the wiring portion 28 to the needle tip side so that the radius of curvature may increase, and thereby the needle tip of each probe 22 displaces relative to the electrode portion 16, to cause a scraping action (or scratching action) to remove a part of the film existing in the surface of the electrode 16. Also, in each probe 22, a part of its tail end cuts into the elastic material layer 36, thereby preventing the needle front portion 30 from falling in the axial direction of the needle presser 24.

According to the auxiliary apparatus 10, as mentioned above, not only the probe is simple in shape and costs less but also the effective area of the probe 22 is small to suit a high frequency test, and though the probe is kept stable, it is easy to manufacture the auxiliary apparatus. Also, the device 12 is disposed in the auxiliary apparatus 10 in a natural and correct state, the electrode portion 16 of the device 12 is surely brought into contact with the needle tip, and besides a scraping action occurs. Further, the structure of the needle presser 24 is simple, and an electric short-circuit between the probes 22 can be surely prevented.

Figure 9:
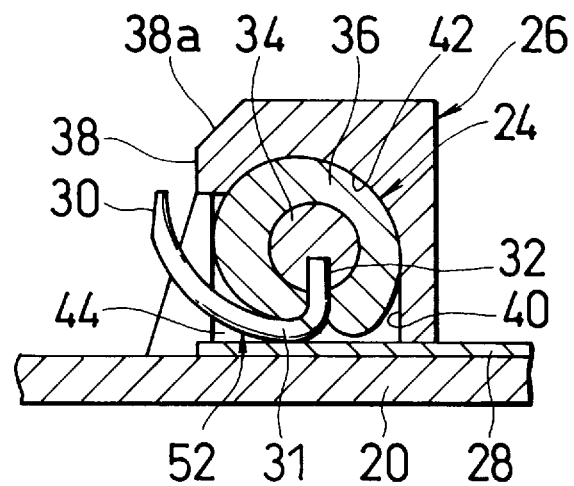
FIG. 9 is a cross-sectional view showing a part of the second embodiment of the auxiliary apparatus for testing.

Referring to FIG. 9, a probe 52 is pressed against the wiring portion 28 at the rear end portion of its deformed potion 31. The needle tail portion 32 having an electrically insulated layer is bent upward and inserted into the needle presser 24. According to this embodiment, too, since the needle tail portion 32 is prevented from moving relative to the needle presser 24, the probe 52 does not move around the needle presser 24 in its peripheral direction. For this reason, when the probe 52 is pressed down by the device to be inspected, the probe 52 is elastically deformed so as to increase its radius of curvature.

Figure 10:
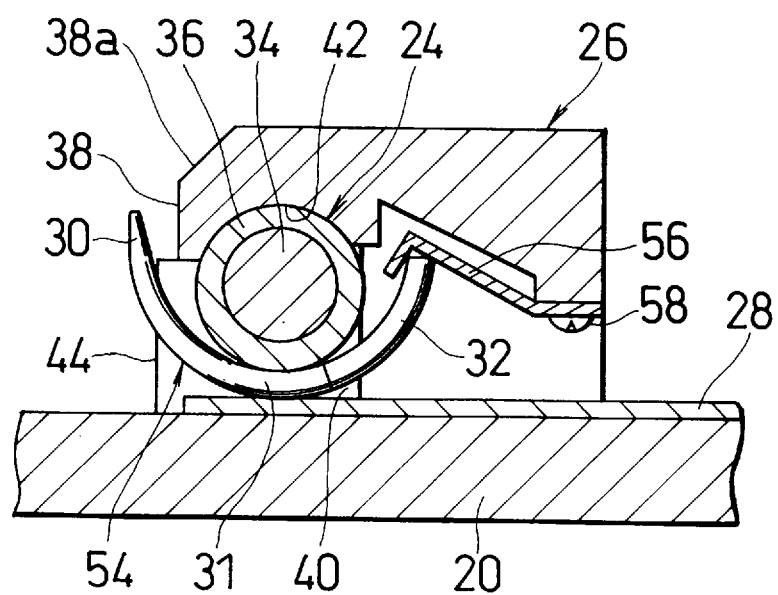
FIG. 10 is a cross-sectional view showing a part of a third embodiment of the auxiliary apparatus for testing.

Referring to FIG. 10, a probe 54 has its tail end abut on a leaf spring 56. The leaf spring 56 is provided in every probe group and is attached to the cover 26 with a plurality of screw members 58. The leaf spring 56 can be formed of an electrically insulated plate material but may be a conductive plate material having an electrically insulated layer formed on its surface, and further, if the tail end of each probe is non-conductive, may be a conductive plate material.

Also according to the embodiment shown in FIG. 10, the probe 54, being prevented from moving relative to the needle presser 24 with its tail end abutting on the leaf spring 56, does not move around the needle presser 24 in its peripheral direction. For this reason, when the probe 54 is pressed down by the device to be inspected, the probe 54 is elastically deformed so as to increase the radius of curvature.

Figure 11:
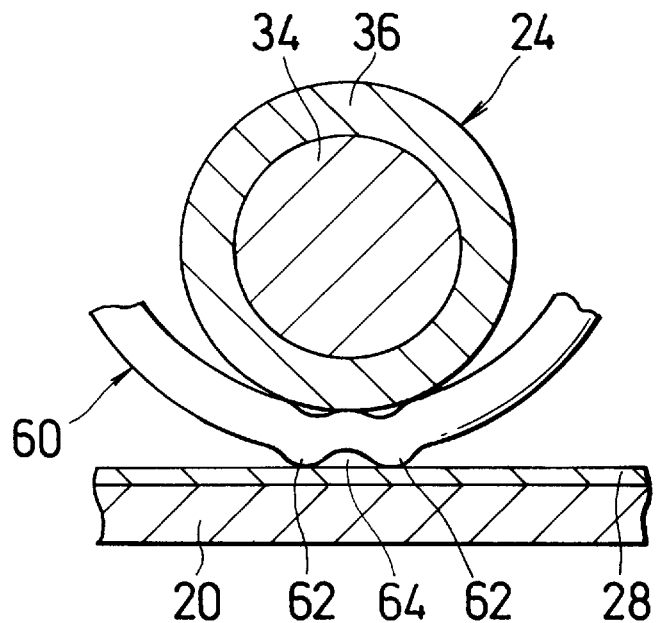
FIG. 11 is a view showing a part of a third embodiment of the probe used in the auxiliary apparatus shown in FIG. 1.

Referring to FIG. 11, a probe 60 has convex portions 62 and a concave portion 64 at the position in contact with the wiring portion 28. The probe 60 is pressed against the wiring portion 62 in the convex portions 62, As a result, in case of the probe 60, the position having the convex portions 62 acts as a deformed portion.

According to the probe 60, the convex portions 62 are engaged with the wiring portion 28, so that the movement of the probe 60 relative to the needle presser 24 is prevented by the engagement of the convex portions 62 and the wiring portion 28. As a result, the electrical connection between the wiring portion 28 and each probe 60 is more ensured. Also, without making the rear end of the probe abut on the deep bottom surface of the groove or the leaf spring or without inserting the needle tail portion of the probe into the needle presser as in case of the above-mentioned probe, the movement of the probe relative to the needle presser 24 when the probe 60 is pressed by the device to be inspected is prevented.

In each of the embodiments mentioned above, it is possible to use a semi-circular needle presser instead of the needle presser 24 making use of a part of the cylindrical portion as the convex portion, or to use a square cylindrical member having a semi-circular convex portion in one surface as a needle presser. Also, the needle presser may be a mere non-conductive bar-like member using no elastic material, so long as the needle presser has non-conduictivity at least in its outer surface.

Figure 12:
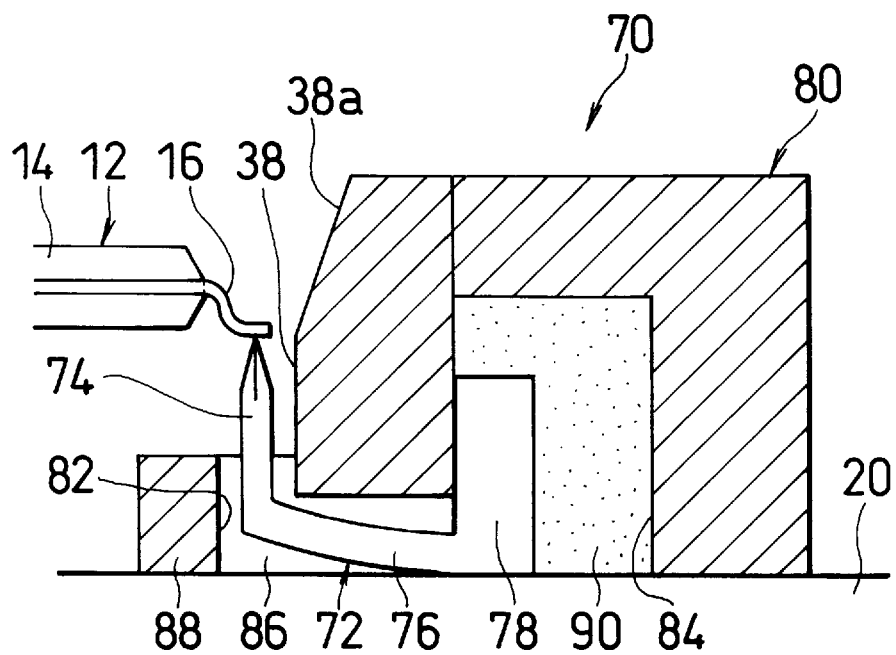
FIG. 12 is a cross-sectional view showing a part of a fourth embodiment of the auxiliary apparatus for testing.

Referring to FIG. 12, an auxiliary apparatus 70 uses an approximately U-shaped probe. The probe 72 is approximately U-shaped by a needle front portion 74, a needle base portion, i.e., a deformed portion 76, and a needle tail portion 78. The needle front portion 74 and the needle tail portion 78 extend linearly upward respectively from the front end and the rear end of the deformed portion 76 in approximately parallel to each other. The needle front portion 74 and the deformed portion 76 are made conductive at least in their outer peripheral surfaces.

The deformed portion 76 extends diagonally upward from the side of its rear end toward the side of the needle front portion 74 and curved in a convex form diagonally downward with a great radius of curvature. The needle tail portion 78 may be either conductive or non-conductive. The needle tail portion 78 has a cross-sectional shape larger than the needle front portion and the deformed portion 76. The probe 72 has either a circular or a rectangular transverse cross-sectional shape. For this reason, the probe 72 has a shape of either a fine line or a strip.

A cover 80 of the auxiliary apparatus 70 includes an opening 38 formed in the center to accommodate the device 12, a plurality of grooves 82 extending from the opening 38 outwardly and in parallel, and a plurality of recesses 84 formed outside the opening 38 to extend in the arranging direction of the grooves 82. Such a cover 80 can be formed from a non-conductive material. The opening 38 is the same as the opening 38 of the cover 26 of the auxiliary apparatus 10. Therefore, the upper portion of the opening 38 is made to be an inclined surface 38a.

The grooves 82 are grooves for accommodating a part of at least the deformed portion 76 of the probe 72. Accordingly, the number of the grooves 82 provided is the same as that of the probes 72 in the illustrated embodiment. The grooves 82 are divided into a plurality of groove groups to correspond to each side of the rectangle forming the opening 38, and are formed in parallel in every groove group. Each groove 82 opens at the side of the base plate 20, that is, downward and at the side of the opening 38 in the tip end upper portion.

Adjacent grooves 82 are partitioned by a partition wall 86. The end portions of adjacent partition walls 86 at the side of the opening 38 are connected by a wall portion 88 closing the corresponding end portions of the grooves 82. It is possible, however, not to connect the end portions at the side of the opening 38 of adjacent partition walls 86 but to open the corresponding end portions of the grooves 82.

The recesses 84 correspond to each side of the rectangle forming the opening 38 and extend along the corresponding sides. In the illustrated embodiment, actually four recesses 84 are provided. Each recess 84 is a groove having a rectangular cross-sectional shape accommodating a needle presser 90 and opens at the sides of the rear end and the base plate 20 of the corresponding groove 82. Each recess 84 has a rectangular cross-sectional shape.

Each needle presser 90 is formed in a rectangular cross-sectional shape of an elastic material such as rubber and is fitted into the recess 84. In the illustrated embodiment, the needle presser 90 has a groove communicated with the groove 82 for receiving a part of the deformed portion 76 and the needle tail portion 78 of the probe 72. Such a groove may, however, be formed in the cover 80 or has to be formed neither in the cover 80 nor in the needle presser 90, depending on the shape and the dimension of the probe.

The auxiliary apparatus 70 can be assembled by arranging each needle presser 90 in the recess 84, arranging each probe 72 such that the deformed portion 76 of the probe 72 comes in the groove 82 and that the needle tail portion 78 comes in the recess 84, overlapping the probe 72, the needle presser 90 and the cover 80 on the base plate 20 in that state, and mounting the cover 80 on the base plate with a plurality of screw members such as bolts in that state.

Each probe 72, in the state of being assembled into the auxiliary apparatus 70, is pressed against the wiring portion of the base plate 20 at the rear end portion of the deformed portion 76 by the needle presser 90. Also, the tip end of each probe 72 projects upward from the groove 82 into the opening 38, the needle tail portion 78 of each probe 72 is pressed against the inner wall surface forming the groove 82 by the needle presser 90, and the rear end face of each probe 72 is received by the needle presser 90. As a result, each probe 72 is pressed against the base plate 20 at the rear end side of the deformed portion 76.

When the tip end of the needle front portion 74 is pressed against the electrode portion 16 of the device 12, the probe 72 is elastically deformed so that the needle front portion 74 and the needle tail portion 78 may spread. Thereby, the probe 72, giving at its tip end a scraping action to the electrode portion 16, removes a part of a film such as an oxide film existing in the surface of the electrode 16.

The auxiliary apparatus 70 not only gives an action and effect similarly to the auxiliary apparatus 10 but also presses the needle tail portion 78 against the inner face of the recess 84 by the needle presser 90, so that the probe 72 is more stabilized.

Figure 13:
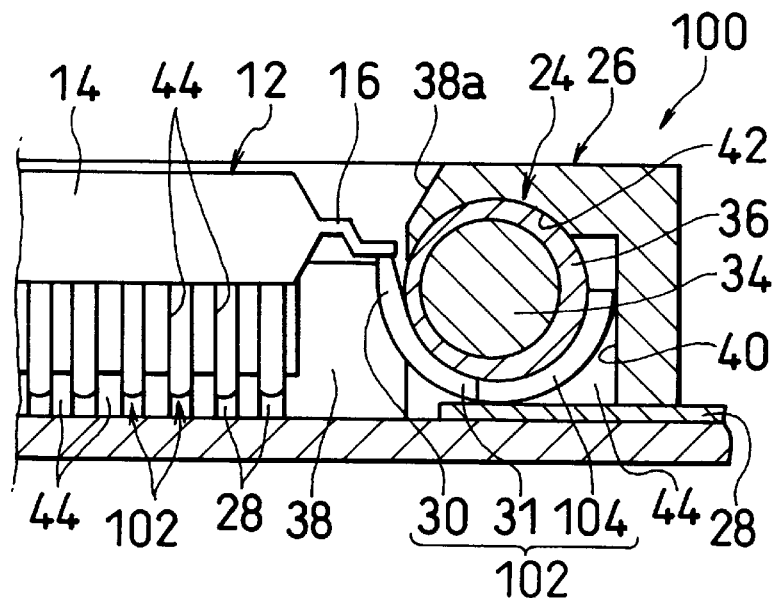
FIG. 13 is a cross-sectional view showing a part of a fifth embodiment of the auxiliary apparatus for testing.
Figure 14A:
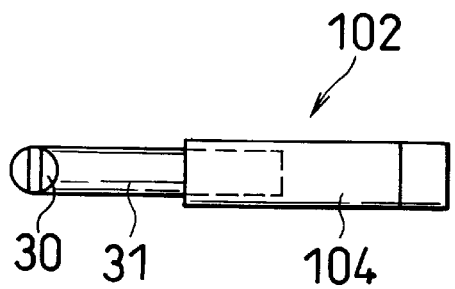
FIG. 14 are views showing an embodiment of the probe used in the auxiliary apparatus shown in FIG. 13, in which (A) is a plan view, (B) is a front elevation, and (C) is a right side view.
Figure 14B:
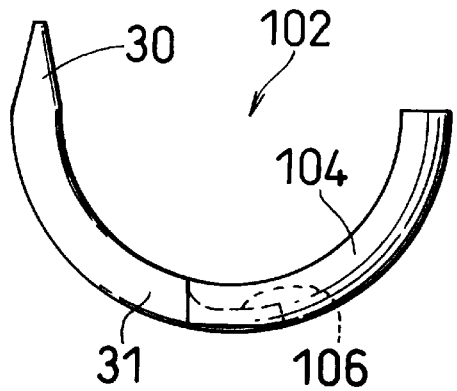
Figure 14C:
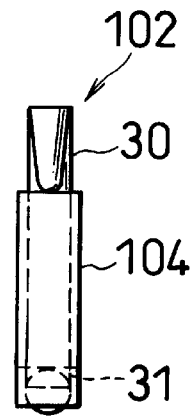

Referring to FIG. 13, an auxiliary apparatus 100 uses a plurality of probe 102 having such a shape as shown in FIG. 14 instead of using probes extending integrally from the tip end to the rear end as in the auxiliary apparatus 10 shown in FIGS. 1 through 6.

Each probe 102 is composed of a needle front portion 30, a deformed portion 31 and a needle tail portion 104 combined with the rear end of the deformed portion 31, and is curved in an arc-like shape at the same curvature over the entire area from the needle point to the rear end. The needle tail portion 104 is formed of an electrically insulated resin material such as a synthetic resin material.

The tip end portion of the needle front portion 30 of each probe 102 is a tapered portion thinner toward the tip end, and the portion backward from its tip end is a bar-like portion having a circular cross-sectional shape. The rear end portion of the deformed portion 31 of each probe 102 has a cutout 106 at the upper side for enhancing the force in combining with the needle tail portion 104.

The inside of the rear end of the deformed portion 31 of each probe 102 is covered by the needle tail portion 104, while the outside portion is exposed without being covered by the needle tail portion 104. Such a probe 102 can be fabricated by using an electrically insulated material such as synthetic resin for the needle tail portion 104.

The auxiliary apparatus 100 using a plurality of probes 102 can be, as shown in FIG. 13, assembled similarly to the auxiliary apparatus 10 except that the deformed portion 31 of each probe 102 is pressed against the wiring portion 28 outside the portion combined with the needle tail portion 104, acts similarly to the auxiliary apparatus 10 and brings about a similar effect as the auxiliary apparatus 10.

Figure 15A:
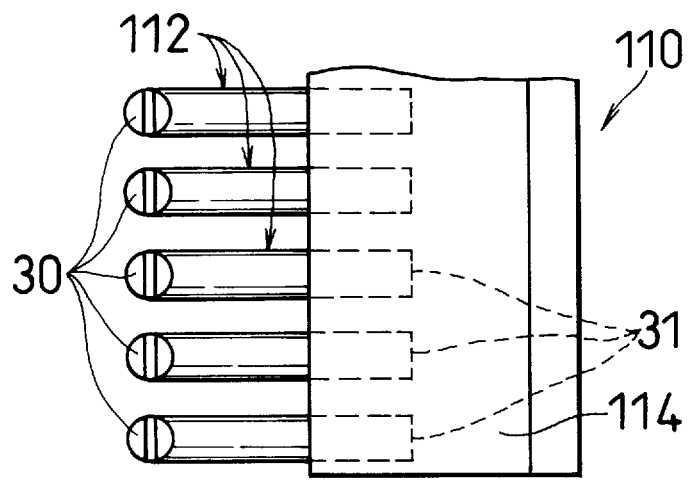
FIG. 15 are views showing another embodiment of the probe used in the auxiliary apparatus shown in FIG. 13, in which (A) is a plan view, (B) is a front elevation, and (C) is a right side view.
Figure 15B:
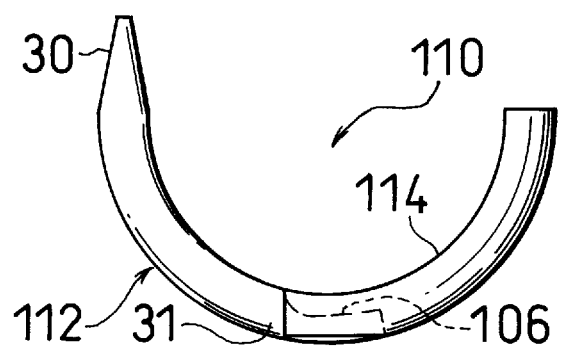
Figure 15C:
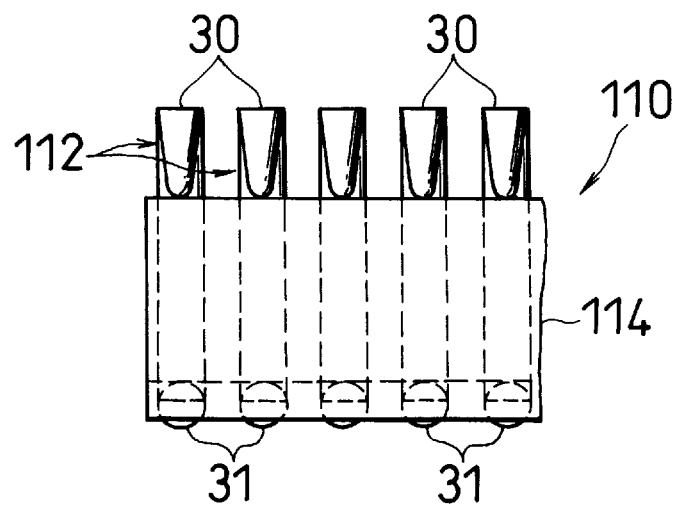

In the auxiliary apparatus 10 or 100, instead of using a plurality of independent probes, one or more needle assemblies 110 with a plurality of probes combined at the needle tail portions can be used, as shown in FIG. 15.

Each probe 112 used in the needle assembly 110 is combined with the common needle tail portion 114 at the probe 112 in the rear end of the deformed portion 31, but otherwise it is formed similarly to the probe 102 shown in FIG. 14.

Therefore, the needle front portion 30 and the deformed portion 31 of each probe 112 are the same as those of the probe 102 shown in FIG. 14, and the deformed portion 31 of each probe 112 has a cutout portion 106 at its upper side for enhancing the combining force with the common needle tail portion 114. The common needle tail portion 114 has an elongate shape curved like a shallow chute made of a non-conductive material, with the same curvature as the needle front portions 30 and the deformed portions 31 of the probes 112.

The common needle tail portion 114 may be made common to every probe group of each side of the rectangle formed by the opening 38 of the aforementioned cover 26, or may be made common to every two or more probes. Also, since adjacent probes 112 are connected to the common needle tail portion 114 in the deformed portions 31, the cover 26 of the auxiliary apparatus using the probe assembly 110 includes neither the groove 40 nor the partition 44. It may, however, include a groove for receiving only the needle front portion 30 and the deformed portion 31 of each probe 112.

While the inside of the rear end portion of each deformed portion 31 is covered by the common needle tail portion 114, the outside thereof is not covered by the common needle tail portion 114 but is exposed. The needle assembly 110 can also be manufactured by fabrication using an electrically insulated material such as synthetic resin as the common needle tail portion 114.

The auxiliary apparatus for testing using the needle assembly 110 can be assembled and utilized similarly to the auxiliary apparatuss 10 and 70 and, besides bringing about actions and effects similarly to the auxiliary apparatus 10, the needle tail portions of the probes 112 are combined in common, so that there is such a merit as to facilitate manufacturing and assembling of the needle assembly 110.

Figure 16:
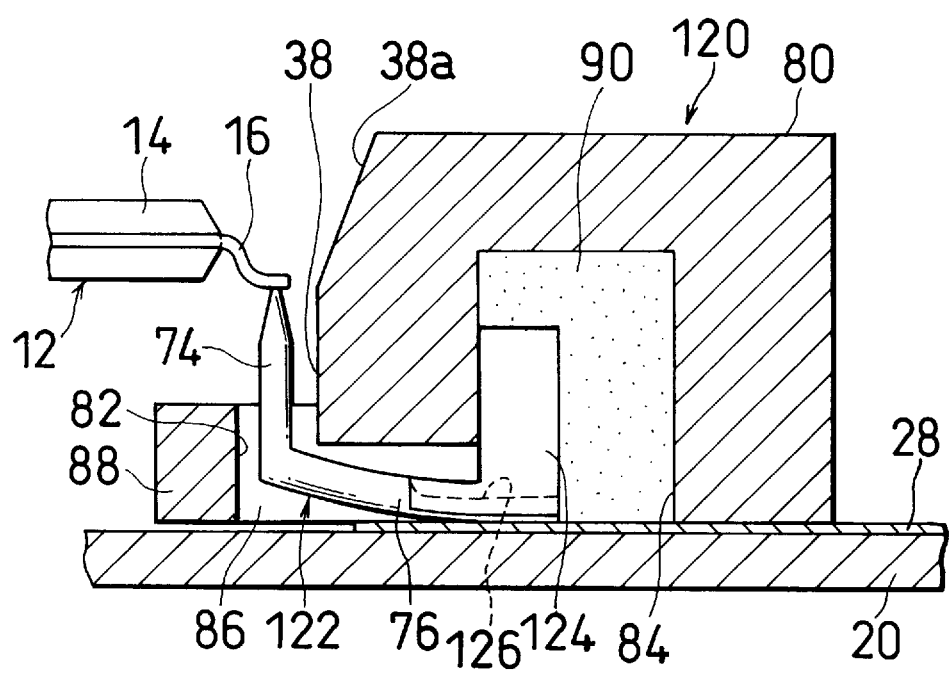
FIG. 16 is a cross-sectional view showing a part of a sixth embodiment of the auxiliary apparatus for testing.
Figure 17A:
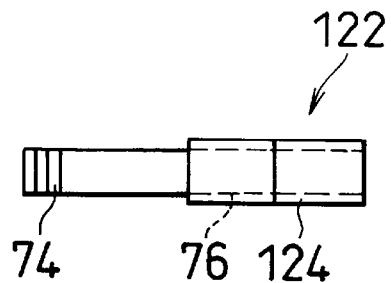
FIG. 17 are views showing an embodiment of the probe used in the auxiliary apparatus shown in FIG. 16, in which (A) is a plan view, (B) is a front elevation, and (C) is a right side view.
Figure 17B:
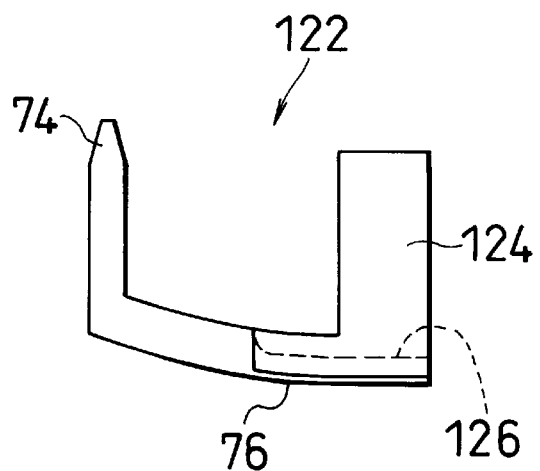
Figure 17C:
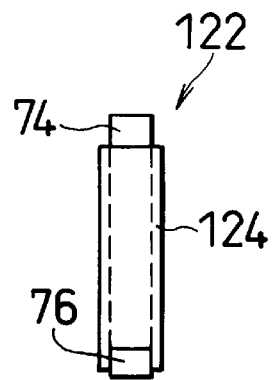

Referring to FIG. 16, an auxiliary apparatus 120 uses a plurality of probes 122 having such a shape as shown in FIG. 17, instead of using the probes 72 integrally extending from the tip ends to the rear ends in the auxiliary apparatus 70 shown in FIG. 12.

Each probe 122 is approximately U-shaped by a needle front portion 74, a deformed portion 76 and a needle tail portion 124 as shown in FIG. 17. The needle front portion 74 and the deformed portion 76 are respectively the same as those of the probe 72 shown in FIG. 12. Therefore, the needle front portion 74 extends linearly upward from the front end of the deformed portion 76 to form an L-shape.

The deformed portion 76 of each probe 122 has a cutout portion 126 at its upper side for enhancing the combining force with the needle tail portion 124. The upper side (inside) portion of the rear end of the deformed portion 76 is covered by the needle tail portion 124, while the lower side (outside) is not covered by the needle tail portion 124 but is exposed.

The needle tail portion 124 is formed of an electrically non-conductive material such as synthetic resin and extends linearly from the rear end of the deformed portion 76 upward in parallel to the needle front portion 74.

The probe 122 can also be manufactured by fabrication using an electrically insulated material such as synthetic resin for the needle tail portion 124. The auxiliary apparatus 120 can also be utilized similarly to the auxiliary apparatuses 10, 70 and 100 and, besides, can give actions and effects similarly to the auxiliary apparatuses 10, 70 and 100.

The auxiliary apparatus 70 or 120 may use one or more needle assemblies 130 having a plurality of probes combined with the needle tail portion, instead of using a plurality of independent probes.

Each probe 132 used in the needle assembly 130 is formed similarly to the probe 122 shown in FIG. 17 except being combined with the common needle tail portion 134 at the rear end of the deformed portion 76.

The deformed portion 76 of each probe 132 has, therefore, a cutout portion 126 at its upper side for enhancing the combining force with the common needle tail portion 134, and the common needle tail portion 134 is made of an electrically non-conductive material to have a comb-like shape.

The needle assembly 130 is approximately U-shaped by the needle front portions 74, the deformed portions 76 and the common needle tail portion 134 of the probes 132. The cover of the auxiliary apparatus using the needle assembly 130 does not have to include a wall portion 86 or 88 shown in FIG. 12.

The deformed portion 76 of each probe 132 has the cutout portion 126 at its upper side for enhancing the combining force with the needle tail portion 124. The upper side (inside) portion of the rear end of the deformed portion 76 is covered by the needle tail portion 124, while the lower side (outside) is not covered by the needle tail portion 124 but is exposed.

The auxiliary apparatus using the needle assembly 130 can be assembled and utilized similarly to the auxiliary apparatuses 70 and 120, and since the needle tail portions 134 of the probes 132 are combined in common, there is such a merit as manufacturing of the needle assembly 130 as well as assembling it into the auxiliary apparatus are facilitated besides bringing about actions and effects similarly to the auxiliary apparatuses 70 and 120.

In the above-mentioned embodiment, the cover is formed by a single member, but it may be formed by a plurality of members. For example, the cover may be formed by a plate-like member having the opening 38 and a member having a groove and a recess. It may be also formed by a plate-like member having the opening 38, a member having a groove, and a member having a recess. Further, it may be formed by a plate-like member having the opening and a recess and a member having a groove.

Figure 19:
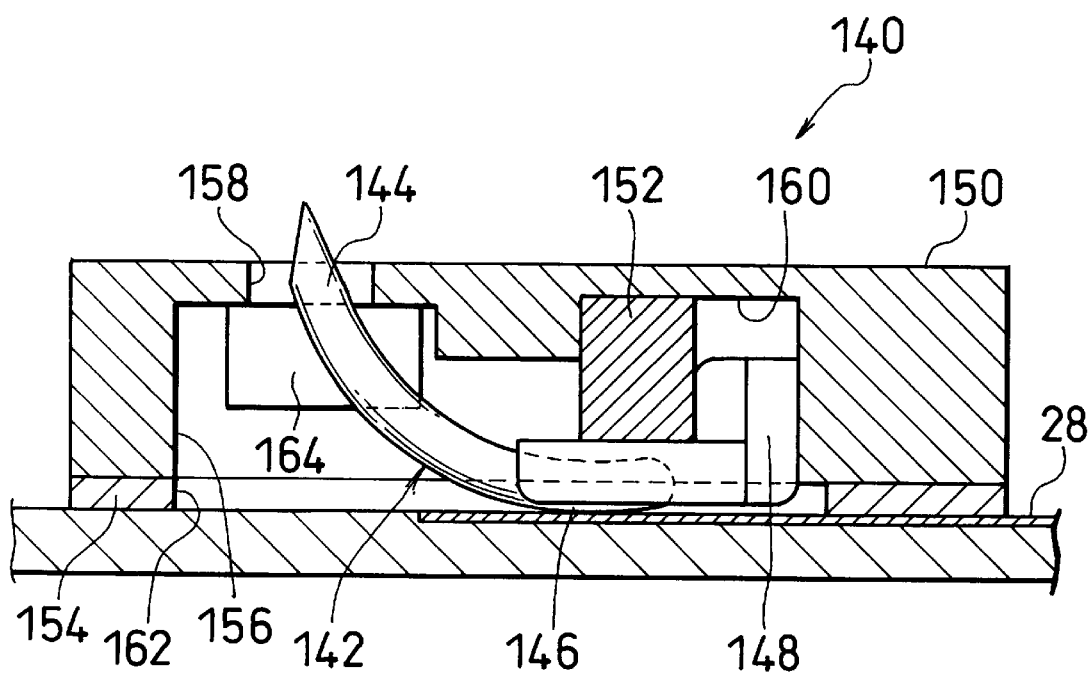
FIG. 19 is a cross-sectional view showing a part of a seventh embodiment of the auxiliary apparatus for testing.

Referring to FIG. 19, the auxiliary apparatus 140 uses a plurality of probes 142 similar to the probe 122 shown in FIG. 17. Each probe 142 is generally curved like an arc from the needle front portion 144 to the rear end of the deformed portion 146. At least the surface of the needle front portion 144 and the deformed portion 146 of each probe 142 has conductivity.

The needle tail portion 148 is L-shaped by an electrically non-conductive material such as synthetic resin and is fixed at the deformed portion 146. The upper side (inside) portion of the rear end of the deformed portion 146 is covered by the needle tail portion 148, while the lower side (outside) is not covered by the needle tail portion 148 but is exposed.

Figure 18A:
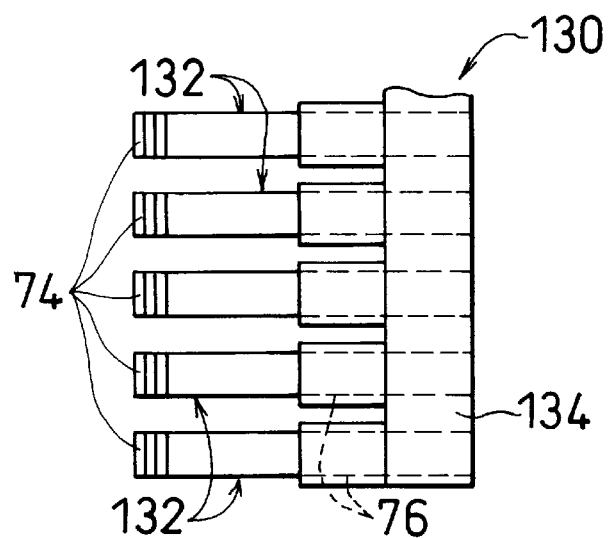
FIG. 18 are views showing another embodiment of the probe used in the auxiliary apparatus shown in FIG. 16, in which (A) is a plan view, (B) is a front elevation, and (C) is a right side view.
Figure 18B:
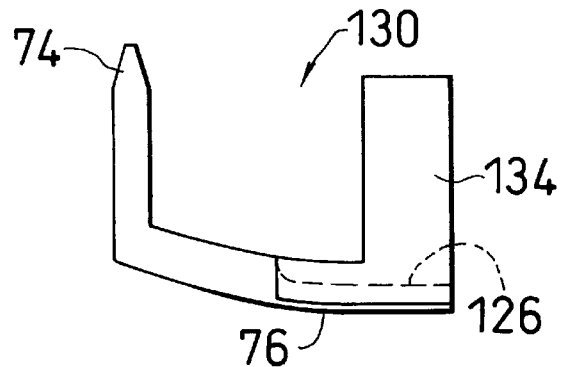
Figure 18C:
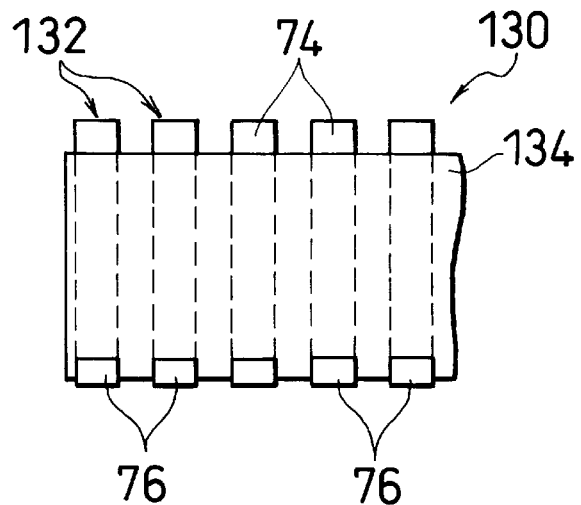

The needle tail portion 148 is independent for every probe 142, but may be made common to adjacent probes. In order to enhance the combining force between the deformed portion 146 and the needle tail portion 148, a cutout portion 126 may be formed at the upper side of the deformed portion 146 as shown in FIGS. 17 and 18.

The auxiliary apparatus 140 has a plurality of elongate covers 150 where a plurality of probes 142 are juxtaposed, with a long needle presser 152 and a spacer 154 disposed within each cover 150.

Each cover 150 includes a first recess 156 opening at the side of the base plate 20, a slot 158 communicating with the first recess 156, and a second recess 160 opening at the side of the first recess 156, as one example is shown in FIG. 19. The first recess 156, the slot 158, and the second recess 160 extend in the arranging direction of the probes 142.

The needle presser 152 is formed of an elastic material such as hard rubber in a rectangular cross-sectional shape and is disposed in the first and second recesses 156 and 160. The spacer 154 includes an opening 162 of approximately the same dimension as the first recess 156, and is disposed between the cover 150 and the base plate 20 such that the first recess 156 and the opening 162 are in conformity with each other.

The probes 142 are juxtaposed in the first recess 156. The probes 142 are juxtaposed such that the needle front portions 144 project upward through the slot 158 and that the needle tail portions 148 extend into the second recess 160, and the rear end of the deformed portions 144 are pressed against the wiring portions 28 of the base plate 20.

Each cover 150 is overlapped on the base plate 20 through the spacer 154, with the probes 142 and the needle presser 152 accommodated, to be assembled into the base plate together with the spacer 154 with suitable means such as a screw member. Thereby, the probes 142, the covers 150, the needle presser 152 and the spacer 154 are assembled as a unit.

The auxiliary apparatuses 140 respectively use such units. Each unit is assembled into the base plate 20 so that the arranging direction of the needle tips of the probes 142 may coincide with the arranging direction of the electrode portion of a device to be inspected and that the needle tips of the probes of the confronting units may confront each other. Thereby, the electrode portion of the device to be inspected is received by the needle tip of each probe 142.

In the illustrated example, the cover 150 does not include a groove for receiving the deformed portion 146 of each probe 142. Therefore, each probe 142 has a spacer 164 abutting against the adjacent probe 142 at the needle front portion 144. The spacer 164 is formed of an electrically non-conductive material as synthetic resin like a plate and is fixed at one of the sides of the probe 142. However, the spacer 164 and the probe 142 may be integrally formed such that the needle front portion 144 of the probe 142 penetrates the spacer 146.

According to the probe 142, it effectively gives a scraping action to the electrode portion of the device to be inspected; nevertheless, there is no fear that the adjacent probes are brought into contact with each other at the needle tip side when the needle tip is pressed against the electrode portion of the device to be inspected.

The spacer 164 may be provided in the aforementioned probes 22, 50, 52, 54, 60, 72, 102, 112, 122, and 132. Also, instead of providing the spacer 164 in each probe, a plurality of adjacent probes may be connected by a non-conductive material such as synthetic resin at a position on the needle tip side.

The present invention is not limited to the above-mentioned embodiments. For example, the probes may be formed in such simple shapes as an arc-shape, a one-side open rectangular shape, a U-shape, an L-shape, a V-shape, a W-shape, etc. Also, the probes may be used with the shapes turned upside down in the foregoing embodiments.

What is claimed is:

1. An auxiliary apparatus for testing a device, comprising: a base plate with a plurality of wiring portions on one face; a plurality of probes; and assembling means for assembling said probes in parallel into said base plate, wherein each probe includes a curved deformed portion, a needle front portion continued to one end of said deformed portion and having a needle tip to be pressed against an electrode portion of the device, and a needle end portion continued to another end of said deformed portion, and wherein said assembling means is provided with a needle pressing portion for pressing said probes so as to bring at least a part of said deformed portion of said probes into contact with the wiring portions of said base plate and extending in an arranging direction of said probes.

2. An auxiliary apparatus according to claim 1, wherein said probe is generally curved in an arc-shape.

3. An auxiliary apparatus according to claim 1, wherein said probe is generally curved in an U-shape.

4. An auxiliary apparatus according to claim 1, wherein the needle tail portion of each probe is formed of an electrically non-conductive material.

5. An auxiliary apparatus according to claim 1, wherein each probe is formed of an electrically conductive material and has an electrically non-conductive material layer in the outer periphery of said needle tail portion.

6. An auxiliary apparatus according to claim 1, wherein each probe is formed of an electrically non-conductive material and has an electrically conductive material layer in the outer peripheries of said needle front portion and said deformed portion.

7. An auxiliary apparatus according to claim 1, wherein the needle tail portions of two or more probes are integrally formed of an electrically non-conductive material.

8. An auxiliary apparatus according to claim 1, wherein said assembling means includes one or more covers assembled into said base plate and one or more needle pressers having said needle pressing portions, wherein said cover has a first recess extending in the arranging direction of said probes and opening at the side of said base plate, a slot communicating with said first recess, and a second recess extending in the arranging direction of said probes and opening at the side of said first recess, wherein said probes are juxtaposed in said first recess with their needle front portions projected from said slot, and wherein said needle presser is received in said second recess.

9. An auxiliary apparatus according to claim 1, wherein each probe includes a spacer abutting against an adjacent probe at the side of the needle tip.

10. An auxiliary apparatus according to claim 1, wherein said assembling means includes one or more covers assembled into said base plate and having a recess extending in the arranging direction of said probes, and one or more needle pressers received in said recess, said recess being opened at a side of said base plate, and said needle presser extending in the arranging direction of said probes and having said needle pressing portion.

11. An auxiliary apparatus according to claim 10, wherein said needle pressing portion abuts against inside portions of at least said deformed portion of said probes.

12. An auxiliary apparatus according to claim 11, wherein said needle presser has a cylindrical shape and is made electrically insulated at least in its outer peripheral portion.

13. An auxiliary apparatus according to claim 11, wherein said needle presser includes a cylindrical presser bar and an elastic material layer formed of an electrical insulation material around said presser bar.

14. An auxiliary apparatus according to claim 10, wherein said recess has an arc-shape or rectangular cross-sectional shape and opens at least at the side of said base plate.

15. An auxiliary apparatus according to claim 10, wherein each of said covers further includes an opening for receiving said device and a plurality of said recesses.

16. An auxiliary apparatus according to claim 15, wherein said probe has its needle front portion projected into said opening.

17. An auxiliary apparatus according to claim 10, wherein said needle presser further presses the needle tail portion of said probe against the inner face of said recess.

18. An auxiliary apparatus according to claim 10, wherein the needle tail portions of two or more probes are integrally formed of an electrically non-conductive material and received in said recess.

* * * * *

UNITED STATES PATENT AND TRADEMARK OFFICE
CERTIFICATE OF CORRECTION

PATENT NO. : 5,888,075
DATED : March 30, 1999
INVENTOR(S) : Y. Hasegawa et al.

It is certified that error appears in the above-indentified patent and that said Letters Patent is hereby corrected as shown below:

| COLUMN | LINE | |
|---|---|---|
| 1 | 24 | "auxliary" should read --auxiliary-- |
| 2 | 30 | After "away)" insert --,-- |
| 6 | 27 | "comer" should read --corner-- |
| 7 | 10 | "go" should read --so-- |
| 8 | 43 | After "portions 62" delete "," and insert --.-- |
| 8 | 66 | "non-conduictivity" should read --non-conductivity-- |

Signed and Sealed this

Twenty-eighth Day of September, 1999

Attest:

Q. TODD DICKINSON

*Attesting Officer*  *Acting Commissioner of Patents and Trademarks*